US010310379B2

(12) United States Patent
Ma et al.

(10) Patent No.: US 10,310,379 B2
(45) Date of Patent: Jun. 4, 2019

(54) MULTIPLE PATTERNING APPROACH USING ION IMPLANTATION

(71) Applicant: Varian Semiconductor Equipment Associates, Inc., Gloucester, MA (US)

(72) Inventors: Tristan Y. Ma, Lexington, MA (US); Maureen K. Petterson, Salem, MA (US); John Hautala, Beverly, MA (US); Steven R. Sherman, Newton, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/458,413

(22) Filed: Mar. 14, 2017

(65) Prior Publication Data
US 2018/0204719 A1    Jul. 19, 2018

Related U.S. Application Data

(60) Provisional application No. 62/446,094, filed on Jan. 13, 2017.

(51) Int. Cl.
| | |
|---|---|
| *G03F 7/40* | (2006.01) |
| *H01L 21/027* | (2006.01) |
| *H01L 21/768* | (2006.01) |
| *H01L 21/311* | (2006.01) |
| *H01L 21/32* | (2006.01) |
| *H01L 21/266* | (2006.01) |

(52) U.S. Cl.
CPC ............ *G03F 7/40* (2013.01); *H01L 21/0279* (2013.01); *H01L 21/266* (2013.01); *H01L 21/31116* (2013.01); *H01L 21/31144* (2013.01); *H01L 21/32* (2013.01); *H01L 21/76831* (2013.01)

(58) Field of Classification Search
CPC ........................................................ G03F 7/40
See application file for complete search history.

(56) References Cited

U.S. PATENT DOCUMENTS

| | | | | |
|---|---|---|---|---|
| 8,133,804 | B1* | 3/2012 | Godet ................. | H01J 37/3056 257/E21.235 |
| 2008/0305443 | A1* | 12/2008 | Nakamura .......... | H01L 21/0273 430/325 |
| 2014/0272728 | A1* | 9/2014 | Sinclair .................... | G03F 7/00 430/327 |
| 2016/0064239 | A1* | 3/2016 | Shih .................... | H01L 21/0273 438/694 |

* cited by examiner

*Primary Examiner* — Kathleen Duda

(57) ABSTRACT

A method for patterning a substrate, comprising: providing a photoresist patterning feature on the substrate, the substrate defining a substrate plane, the photoresist patterning feature having a softening temperature below 200° C. The method may include directing a first ion species into the photoresist patterning feature during a first exposure; and depositing a sidewall layer on the patterning feature after the directing at a deposition temperature, the deposition temperature being 200° C. or greater.

18 Claims, 4 Drawing Sheets

MULTIPLE PATTERNING APPROACH USING ION IMPLANTATION

RELATED APPLICATIONS

This application claims priority to U.S. Provisional Patent Application No. 62/446,094, filed Jan. 13, 2017, entitled Multiple Patterning Approach Using Ion Implantation, and incorporated by reference herein in its entirety.

FIELD

The present embodiments relate to substrate patterning, and more particularly, to techniques for treating patterning features with ions.

BACKGROUND

As semiconductor devices scale to smaller dimensions, due to the limits of simple lithography techniques, new approaches have been developed to define devices and features having dimensions that are less than a smallest feature size defined by lithography. Self-aligned multiple patterning (SAMP) schemes have been developed, such as self-aligned double patterning (SADP) and self-aligned quadruple patterning (SAQP). These techniques may be used in the semiconductor industry in combination with 193 nm immersion lithography, and potentially in combination with extreme ultraviolet (EUV) lithography. One of the biggest issues for widespread use of SAMP is the significantly higher costs. One manner of reducing costs is to use photoresist instead of other hardmask materials as a first mandrel, which approach in principle eliminates a series of etch and deposition operations. This cost reduction is especially attractive to memory manufacturers whose products are more sensitive to costs.

Notable challenges for using photoresist as a first mandrel include the ability to maintain line edge roughness (LER) and line width roughness below acceptable levels, the need to employ a potentially damaging trim process after lithography, as well as compatibility of photoresist with sidewall material processes used in SAMP schemes. Regarding the latter issue, in a known SAMP process flow, an $SiO_2$ spacer film is deposited directly on a resist-mandrel. In this regard, low-temperature $SiO_2$ deposition processes are employed to avoid resist deformation. The temperature of deposition employed is lower than the photoresist's glass transition temperature, equivalent to a softening temperature, and typically 110° C.-120° C. For example, plasma enhanced atomic layer deposition (PEALD) may be carried out at a temperature of less than ~80° C. for a duration of less than ~90 seconds. These low temperature PEALD processes result in reduced conformality, higher reactivity, and enhanced defectivity of the deposited. $SiO_2$ film. This low quality $SiO_2$ spacer exhibits poor etch selectivity, which poor etch behavior places a constraint that a feature formed from this process maintain a minimum height to ensure pattern transfer to a layer below the spacer. The additional operations of critical-dimension (CD) trimming and. LER reduction, employed in a SAMP process flow, place further challenges on maintaining acceptable spacer height requirement, since both CD trimming and LER reduction inherently consume photoresist and result in loss of resist-mandrel height.

Accordingly, with respect to these and other considerations the present disclosure is provided.

BRIEF SUMMARY

In one embodiment, a method for patterning a substrate may include providing a photoresist patterning feature on the substrate, the substrate defining a substrate plane, the photoresist patterning feature having a softening temperature below 200° C. The method may also include directing ions into the photoresist patterning feature during a first exposure; and after the directing the ions, depositing a sidewall layer on the photoresist patterning feature at a deposition temperature, the deposition temperature being 200° C. or greater.

In a further embodiment, a method for patterning a substrate may include providing a photoresist patterning feature on the substrate, where the photoresist patterning feature has a first critical dimension (CD) and has a first carbon concentration. The method may also include directing first ions to the photoresist patterning feature, wherein after the directing the first ions the photoresist patterning feature attains a second CD, less than the first CD. The method may additionally include directing second ions to the photoresist patterning feature, wherein after the directing the second ions, the photoresist patterning feature has a second carbon concentration, wherein the second carbon concentration is greater than the first carbon concentration.

In another embodiment, a method for patterning a substrate may include providing a photoresist patterning feature on the substrate, the photoresist patterning feature having a first critical dimension (CD) and comprising an oxygen-containing polymer having a first oxygen concentration. The method may further include directing first ions to the photoresist patterning feature, wherein after the directing the first ions the photoresist patterning feature attains a second CD, less than the first CD. The method may also include directing second ions to the photoresist patterning feature, wherein after the directing the second ions the photoresist patterning feature has a second oxygen concentration, wherein the second oxygen concentration is less than the first oxygen concentration.

DETAILED DESCRIPTION

The embodiments described herein provide techniques for processing a patterning feature such as a photoresist feature using exposures of energetic species including one species of ions, or multiple species of ions. The term "photoresist patterning feature" as used herein, refers to photoresist structures used to transfer a pattern into a substrate. Various embodiments provide advantages over known techniques used to process photoresist, and in particular, in advanced patterning techniques such as SAMP. The present embodiments may be especially useful for patterning a substrate, using a variety of photoresist materials where the softening point or decomposition point of a photoresist feature is below 150° C., 200° C., or 300° C. The photoresist materials used to form a photoresist patterning feature may be an oxygen-containing polymer, such as a polymer based upon polymethylmethacrylate (PMMA) or a phenol formaldehyde polymer. As an example, PMMA based photoresist material has a softening point of 125° C. Moreover, many phenol formaldehyde resins have a decomposition temperature of 220° C. or so.

Figure 1A:
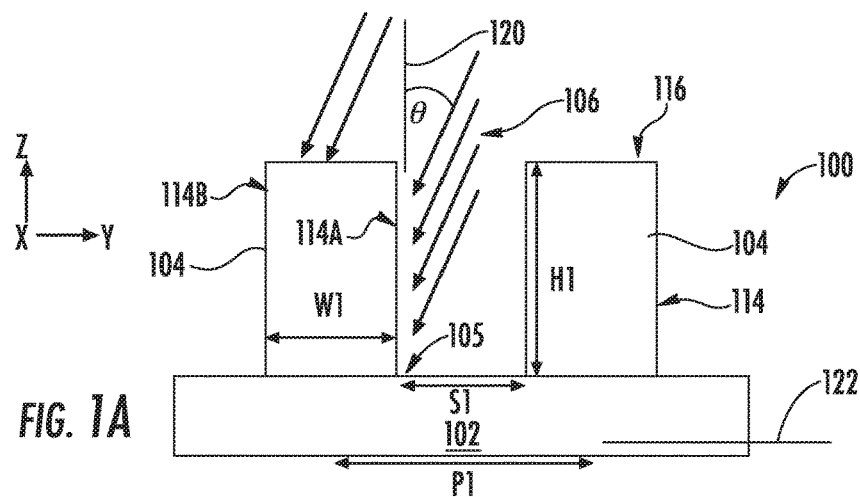
FIGS. 1A-1D depict a cross-sectional view of a photoresist feature at various instances illustrating exemplary operations involved in a method for patterning a substrate according to various embodiments of the disclosure.

Turning to FIGS. 1A-1D, there are shown a sequence of operations involved in a method for patterning a substrate 100 according to various embodiments of the disclosure. This sequence may represent an improvement on known SAMP processing. In the illustration provided, a variant of SADP processing is shown, while the principles illustrated may be extended to other types of SAMP processing as will be readily apparent to those of skill in the art. In FIG. 1A, there is shown an instance where a photoresist patterning feature 104 is provided on the substrate 100, in particular, on the substrate base 102. The photoresist patterning feature 104 may be formed, for example, using known lithography techniques, such as UV lithography or extreme ultraviolet (EUV) lithography. In various embodiments, the substrate base 102 may include multiple layers (not shown) including an interlayer such as an antireflection coating (ARC), spin on carbon (SOC) layer, oxide, nitride, silicon, or other layer.

As described below, the photoresist patterning feature 104 may be used as a support mandrel for forming subsequent patterning features to be used to pattern the substrate base 102. As shown in FIG. 1A, the substrate 100 defines a substrate plane 122 lying parallel to the X-Y plane of the Cartesian coordinate system shown. The photoresist patterning feature 104 may be arranged in an array of patterning features as shown. In various embodiments, the CD of the photoresist patterning feature 104 along the X-axis may be on the order of 100 nm or less, where "CD" may refer to a minimum feature size. In turn, the use of a SAMP process may generate patterned features having smaller CD than the CD of the photoresist patterning feature 104. Moreover, the SAMP process, such as a SADP process, may generate a feature pitch that is one half the pitch between adjacent photoresist patterning features.

As further shown in FIG. 1A, the photoresist patterning feature 104 may be characterized by a first feature width W1 and a height H1, where these dimensions may range between several nanometers to many tens of nanometers. The embodiments are not limited in this context. Additionally, the photoresist patterning feature 104 may be arranged in an array characterized by a spacing S1 between edges of adjacent photoresist patterning features, as well as a pitch P1 between centers of adjacent photoresist patterning features. In accordance with the present embodiments, the operations of FIGS. 1A-1D provide an improved SAMP process by subjecting the photoresist patterning features 104 to novel ion treatments.

As further shown in FIG. 1A, ions 106 are directed to the photoresist patterning features 104 during a first exposure. In some embodiments, the ions 106 may be directed at normal incidence along the perpendicular 120 to the substrate plane 122. In other embodiments, the ions 106 may be directed at a first ion trajectory forming a non-zero angle of incidence θ with respect to the perpendicular 120 to the substrate plane 122, as suggested by FIG. 1A (in the limiting case θ may approach zero). The ions 106 may represent just one ion exposure to one ion species, a plurality of sub-exposures to a given ion species, or a plurality of different ion exposures to different ion species, or a combination of the above. The ions 106 may include a silicon-containing ion species, hydrogen ions, helium ions, argon ions, carbon ions, nitrogen ions, krypton ions, xenon ions or germanium ions. The embodiments are not limited in this context.

Figure 1B:
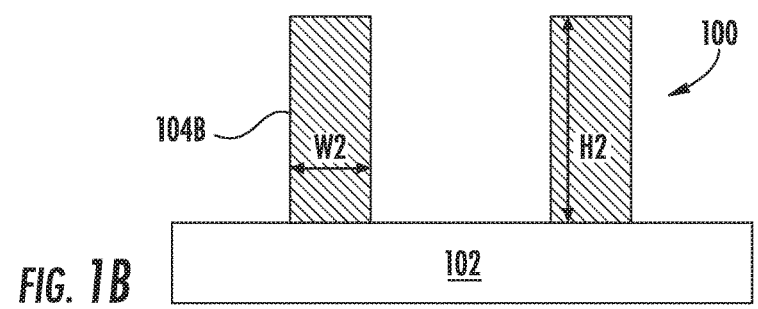

The ions 106 may alter the photoresist patterning features 104 in multiple ways. For one, the ions 106 may perform so-called CD trimming where the width of photoresist patterning features 104 is reduced. In other words, the photoresist patterning feature 104 may have a first feature width W1 before the directing of the ions 106 to the substrate 100, and may have a second feature width W2 after the directing of the ions 106, as shown in FIG. 1B, where the second feature width is less than the first feature width. This reduction of feature width is advantageous for subsequent processing to provide adequate room for sidewalls to be formed on the photoresist patterning features 104.

As also shown in FIG. 1B the photoresist patterning features 104 may be changed by exposure to ions 106 to form the modified photoresist patterning features 104B. As discussed below, the modification of photoresist patterning features 104 may include changes in density and composition, where these changes alter the properties of the photoresist patterning features 104 in an advantageous manner for SAMP processing. In particular embodiments, the ions 106 may impart better thermal stability to the modified photoresist patterning features 104B. In some embodiments, while the softening temperature of the photoresist patterning features 104 may be 200° C. or less, and in particular less than 150° C., the modified photoresist patterning features 104B may be thermally stable to 300° C. or higher.

Figure 1C:
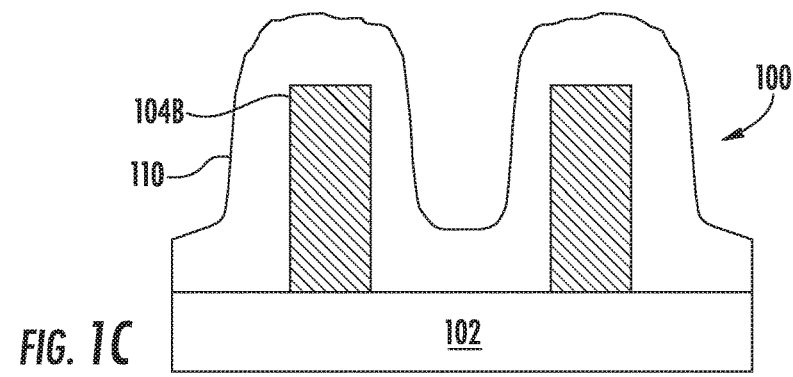

Turning now to FIG. 1C, there is shown the structure of the substrate 100 after the depositing of a sidewall layer 110 on the modified photoresist patterning features 104B. The deposition temperature for forming the sidewall layer 110 may be 200° C. or greater in various embodiments. The deposition temperature may be 300° C. or up to 350° C. in some embodiments. In accordance with some embodiments, the sidewall layer 110 may be formed using an atomic layer deposition process conducted at 200° C., 250° C., 300° C., or 350° C. The embodiments are not limited in this context. An example of an appropriate material for sidewall layer 110 is $SiO_2$. The embodiments are not limited in this context. The relatively higher temperature for deposition of sidewall layer 110 is afforded by the thermal stability of modified photoresist patterning features 104B that is imparted by the ions 106. Notably, as discussed above, known SAMP processes that employ photoresist mandrels may employ relatively lower deposition temperatures for forming a sidewall layer, such as below 125° C., limiting the quality of the sidewall layer, as well as the rate of deposition.

In other embodiments, the deposition of sidewall layer 110 may be performed using a chemical vapor deposition (CVD) process, for example at deposition temperatures of 250° C., 300° C., or 350° C. An advantage of using CVD for forming sidewall layer 110 is the relatively lower cost and lesser processing time as compared to ALD processes.

Figure 1D:
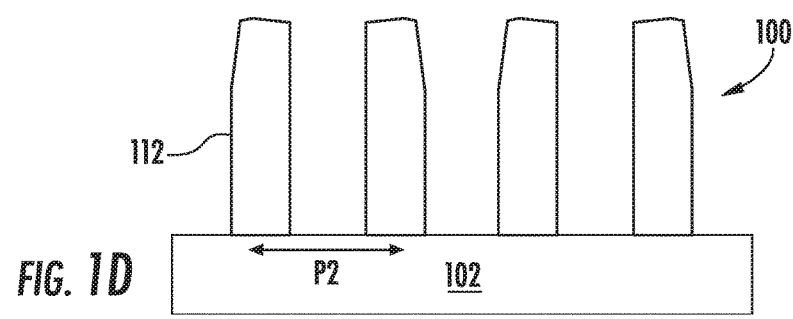

Turning now to FIG. 1D, there is shown a subsequent instance after processing to form sidewall spacers 112. The sidewall spacers 112 are formed from the material of sidewall layer 110, and may be generated using known processing techniques, including etching of the sidewall layer 110, followed by selective etching, such as plasma ashing, to remove the modified photoresist patterning features 104B. As such, the sidewall spacers 112 represent a patterning structure having a pitch P2, half of the distance of P1. The sidewall spacers 112 are also more robust as compared to known SADP spacers formed using a low temperature (less than 125° C.) deposition process, such as low temperature ALD. For example, because the deposition temperature may be above 150° C., a much higher quality oxide is produced for sidewall spacers 112, generating a better etch selectivity for underlying layers (not individually shown) in the substrate base 102, such as ARC layers. This better etch selectivity relaxes the height requirement for the photoresist patterning features 104, and accordingly leaves more room for CD trimming as well as well as LER reduction using ions 106.

Figures 2A, 2B, 2C, 2D, 2E:
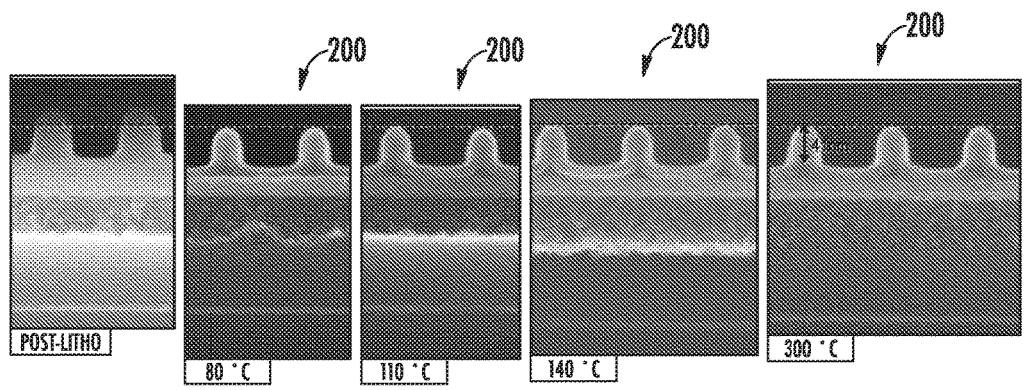
FIG. 2A depicts a cross-sectional micrograph of a reference photoresist sample.
FIGS. 2B-2E are cross-sectional micrographs of photoresist structures after treatment using ions according to embodiments of the disclosure, shown as a function of post treatment temperature.

Turning now to FIG. 2A, there is shown a cross-sectional micrograph of reference photoresist features after patterning, exhibiting a height of approximately 60 nm. FIGS. 2B-2E are cross-sectional micrographs of modified photoresist features 200 after implantation using ions according to embodiments of the disclosure, shown as a function of post implantation temperature. The samples shown in these figures were implanted with a two-operation implant recipe, including an implantation of 2 keV H+ with 0° ion angle of incidence and 1E15/cm² dose, followed by an implantation using 2 keV Si+ with 24° incidence angle and 1E16/cm² dose. The different treatment temperatures range from 80° C., to 110° C., 140° C., and 300° C., mimicking the thermal conditions for deposition of a sidewall layer at corresponding temperatures. After ion implantation, the height of the modified photoresist features 200 is reduced to 41 nm. Notably, the height of the modified photoresist features 200 does not change as a function of treatment temperature up to 300° C., indicating thermal stability of the modified photoresist features 200 up to over 300° C. In a parallel series of experiments, the same photoresist was used to pattern photoresist features with no implanting of the patterned photoresist features. After lithographic patterning, the patterned photoresist features exhibited a height of 49 nm. When heated to 80° C., the height of the patterned photoresist features decreased to 48 nm, and to 38 nm at 140° C., meaning a loss of 22% in height. When heated to 200° C. and 300° C., no resist features remained, indicating a complete loss of photoresist.

While not limited as to a particular theory, the increased thermal stability imparted to photoresist patterning features may be caused by a combination of chemical and physical changes resulting from the ion treatment.

Figure 2F:
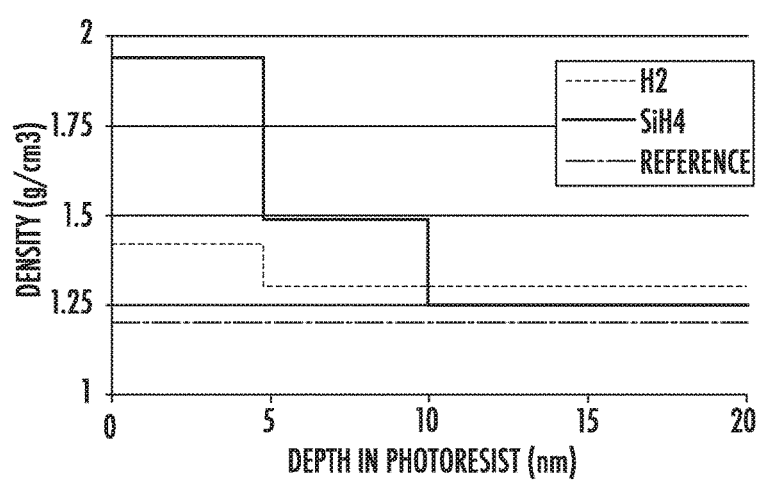
FIG. 2F depicts density profiles of photoresist subject to different ion treatments according to embodiments of the disclosure.

FIG. 2F depicts density profiles of photoresist subject to different ion treatments (as well as no ion implantation (reference)) according to embodiments of the disclosure. The density profiles are measured by x-ray reflectometry techniques and represent density of a blanket photoresist material after being subject to $H_2$ (3 kV 3E16/cm²) or $SiH_4$ (3 kV 3E16/cm²) implantation, as a function of depth. Significant surface (<5 nm) densification is observed, while the bulk of the resist (10 nm or deeper) experiences some degree of densification, as reflected in a higher bulk density (such as density at 10 nm or deeper from the surface) as compared to the reference sample. The hydrogen implant, having an implantation depth of approximately 200 nm into the resist at 3 keV implant energy, results in the most bulk densification. The $SiH_4$ implant was also done at 3 keV implant energy; the effect of a heavier species implanted near the surface of the photoresist is shown by having a higher density in the first 10 nm immediately below the surface.

Figure 2G:
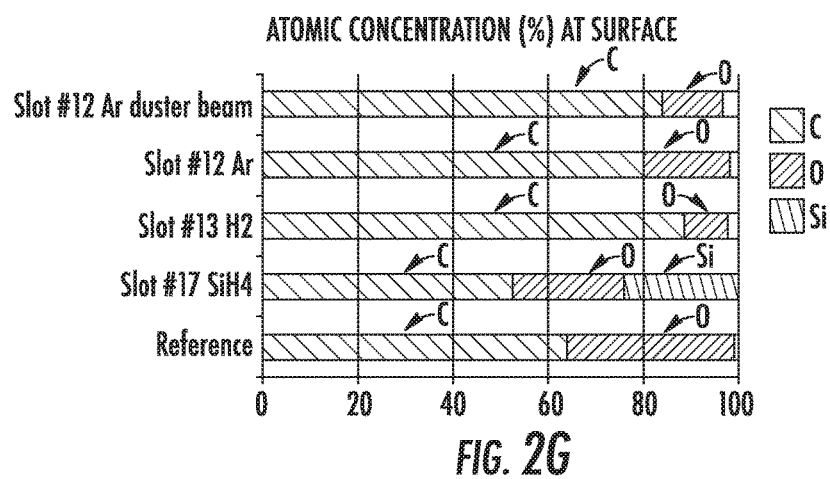
FIG. 2G depicts composition of photoresist subject to different ion treatments according to embodiments of the disclosure.

FIG. 2G depicts composition of photoresist subject to different ion treatments, according to embodiments of the disclosure. The composition is shown as a function of carbon content, oxygen content, and silicon content, in particular. The composition is measured near the surface of blanket photoresist samples using x-ray photoelectron spectroscopy. Notably, hydrogen is not detected by this method and the concentration is normalized to the detected species. In all the samples, the oxygen content is reduced (with respected to the reference, unimplanted, sample) wherein the photoresist comprises a first oxygen concentration before implantation and comprises a second oxygen concentration after the implantation, wherein the second oxygen concentration is less than the first oxygen concentration. Similarly, in all save the 3 kV $SiH_4$-implanted samples, the carbon concentration is increased. In other words, the photoresist may comprise a first carbon concentration before implantation, and comprise a second carbon concentration after implantation, wherein the second carbon concentration is greater than the first carbon concentration. As a particular example, a 750 V Ar implantation resulted in an increased C concentration and a decreased O concentration. For Ar cluster beam, Ar ion beam, and $H_2$ ion beam implantation, the ion implantation generates a ratio of carbon-to-oxygen in the photoresist of greater than 4:1. Moreover, the ratio of carbon-to-oxygen increases and the absolute concentration of oxygen decreases in the 3 kV $SiH_4$-implanted samples. Implantation using hydrogen, while a low mass ion, produces the highest carbon level, where the carbon concentration approached 90% (possibly due to more intensive dehydrogenation) and oxygen concentration is less than 10%.

The above results indicate that the choice of ion species or a combination of ion species may be tuned to generate a densified and graphitized photoresist mandrel to be used as a patterning feature, where the graphitization may play a role in the increased thermal stability of the patterning feature.

In accordance with various embodiments of the disclosure, substantial CD trimming of the photoresist patterning features 104 may be accomplished with just a small reduction in height of the photoresist patterning features 104. This preferential etching of the width of photoresist patterning features 104 with respect to the height is useful to preserve adequate height of the eventual patterning features to be formed, leading to a more robust patterning process for patterning the substrate base 102. In particular embodiments, the non-zero angle of incidence θ for the trajectory of ions 106 is tuned to increase this preferential etching. In particular, the dependence of sputtering yield on ion incidence angle is exploited to increase the relative sputter removal from the sidewalls 114 with respect to the sputter removal from the top surface 116 of photoresist patterning features. Turning now to FIG. 3A, there is shown a cartoon illustrating details of the geometry of silicon ions 306 as incident upon a photoresist patterning features 304. In this example, the non-zero angle of incidence θ as defined above coincides with the parameter $\theta_1$ where the parameter $\theta_1$ is defined as the angle of incidence with respect to a perpendicular to the plane of the top surface 116 of the photoresist patterning feature 304. Assuming the top surface 116 is parallel to the substrate plane 122, then $\theta_1$ is the same as θ. The parameter $\theta_2$ represents the angle of incidence with respect to a perpendicular to the plane of the sidewall 114 of the photoresist patterning feature 304. Assuming the sidewall 114 is perpendicular to the substrate plane 122, then $\theta_2$ is the complementary angle to $\theta_1$.

Figure 3B:
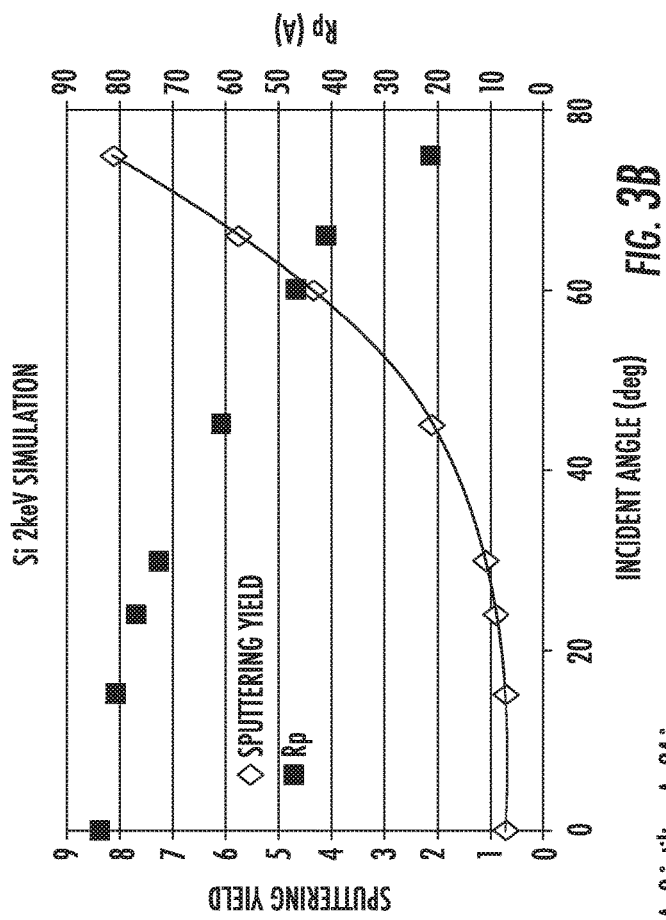
FIG. 3B depicts the effect of ion angle of incidence on sputter yield and implant depth for a photoresist feature subject to Si ion treatment.
Figure 3C:
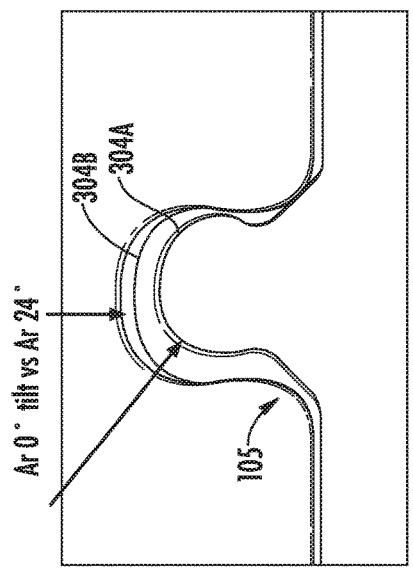
FIG. 3C depicts the effect of ion angle of incidence on photoresist feature profile, for photoresist patterning features subject to ion treatment according to embodiments of the disclosure.
Figure 3A:
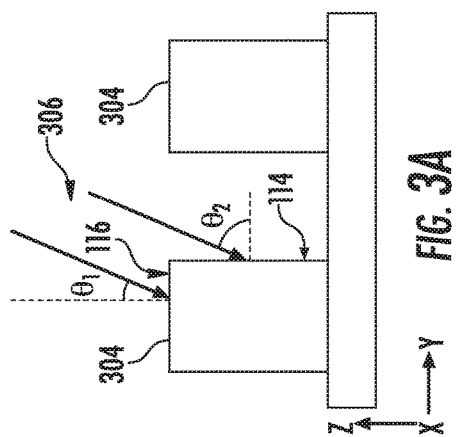
FIG. 3A depicts the geometry for processing a photoresist patterning feature using ions according to various embodiments of the disclosure.

Turning to FIG. 3B, there is shown the results of simulation of implantation depth (Rp) and sputtering yield of PMMA as a function of ion incidence angle for 2 keV Si ions. As shown, the sputtering yield increases from approximately 0.75 when θ approaches zero, to a value of 8.2 when θ=75°. While not shown, as will be readily appreciated by those of ordinary skill in the art, the sputtering yield decreases to zero at ninety degrees. In FIG. 3A, when 2 kV Si ions, silicon ions 306, are directed to the photoresist patterning feature 304 along a trajectory forming a non-zero angle of incidence θ of 30°, meaning that $\theta_1$ is also equal to 30°, a sputtering yield of 1.072 is obtained for the top surface 116. The trajectory of silicon ions 306 on the sidewalls 114 forms the complementary ion incidence angle to $\theta_1$, and accordingly defines the value of $\theta_2$ to be 60°, corresponding to a higher sputter yield as shown by the graph of FIG. 3B. Accordingly, the sputtering yield for 2 kV Si ions incident on the sidewalls 114 at $\theta_2$=60° is 4.341. Based on this simulation, ~4.3 nm of photoresist is trimmed from the sidewall 114 along the Y-axis when just ~1.1 nm is trimmed from the top surface 116 along the Z-axis in the height direction. Accordingly, for a photoresist patterning feature 104 having a height H1 of 50 nm and a feature width W1 of 40 nm, the feature width may be reduced to a value of W2 of 20 nm while height is marginally reduced to a value of H2 of 45 nm.

In additional embodiments, the non-zero angle of incidence θ for the trajectory of ions 106 may be tuned to reduce the top rounding of the top surface 116 as well as footing in the region 105 of sidewalls 114. Turning to FIG. 3C, there is shown the effect of ion angle of incidence on sidewall profile. The cross-sectional transmission electron microscopy (TEM) images show the profile of photoresist features after exposure to a 0.75 keV, 6E15 Ar implant at 0 degrees and 24 degrees ion angle of incidence relative to the substrate normal. When ions are directed at zero degrees angle of incidence (with respect to a perpendicular 120 to the substrate plane 122), the photoresist patterning feature 304A is rounded at the top and exhibits extensive footing. When the ion trajectory forms a non-zero angle of incidence θ of 24 degrees the photoresist patterning feature 304B exhibits less rounding on the top and less footing at the region 105.

Returning to FIG. 1A, while the ions 106 are depicted as impinging upon one sidewall, sidewall 114A, in various embodiments, an ion exposure may entail a plurality of sub-exposures to different sidewalls. For example, in some embodiments, a first ion species (represented by ions 106) is directed to the sidewall 114A in one sub-exposure and the first ion species is directed to the sidewall 114B in another sub-exposure. For example, an exposure to ions 106 may comprise a plurality of sub-exposures, wherein a given sub-exposure includes directing the first ion species at a first ion trajectory forming a non-zero angle of incidence θ with respect to the perpendicular 120, and rotating the substrate 100 through a 180-degree rotation about the perpendicular 120. Accordingly, the sidewall 114A and sidewall 114B are exposed in successive sub-exposures to the ions 106. To prevent photoresist patterning features 104 from deformation due to stress differences induced from ion implantation, the total dose of an ion exposure may be divided into an even number of sub-exposures where the ion dose per sub-exposure is on the order of ~$10^{14}$/cm². In various embodiments, the ion dose for a given sub-exposure may range between 5E13/cm² to 5E14/cm². Accordingly, because the substrate 100 is rotated 180° between successive sub-exposures, the excess implantation received by a given sidewall 114A as compared to 114B (or vice versa) does not exceed a value on the order of $10^{14}$/cm². The final total dose to accomplish graphitization, CD trimming, and LER reduction may range between $10^{15}$ to $10^{16}$/cm². The embodiments are not limited in this context. Notably, referring again to FIG. 3B, to generate a target amount of CD trimming, the appropriate ion dose may be calculated based upon the ion species, patterning feature material, ion energy, and ion angle of incidence with respect to perpendicular or normal to a plane of the patterning feature being trimmed, such as the sidewall.

Returning again to FIG. 1A, in various embodiments, the ions 106 may be provided as a plurality of exposures, wherein a first ion species is directed to the photoresist patterning features 104 in a first exposure, and wherein a second ion species is directed to the photoresist patterning features 104 in a second exposure. In some embodiments, the first ion species and the second ion species may be directed at an ion trajectory forming a non-zero angle of incidence θ with respect to the perpendicular 120 to the substrate plane 122, wherein θ is between 10 degrees and 60 degrees. The embodiments are not limited in this context.

This multiple exposure treatment facilitates independent tailoring of different properties of the photoresist patterning features 104, such as the independent control of CD trimming as opposed to the graphitization of the photoresist patterning features 104. In some embodiments, in a first exposure first ion species may comprise hydrogen ions, silane ions, or argon ions, while in a second exposure second ion species may comprise argon ions, silicon ions, krypton ions, xenon, ions, or germanium ions. In some embodiments, the ion energy in a first exposure may range between 0.5 keV-20 keV, and the ion energy of the second exposure may range between 0.5 keV-3 keV. The embodiments are not limited in this context. An exemplary recipe for performing resist trimming, LER reduction, as well as graphitization may be as follows. In operation One, a first ion exposure using an H$^+$ implant with ion energy of 2 keV and 1E15/cm² total ion dose, where the first exposure is divided into 4 sub-exposures with an ion dose of 2.5E14/cm² per sub-exposure, and where the twist angle is varied between successive sub-exposures. In one implementation for implanting an equiaxed patterning feature such as a circular pillar, the 4 sub-exposures are directed at four rotational positions that are equally spaced by 90 degrees between adjacent rotational positions. In embodiments where the patterning feature is a line having opposing sidewalls, the four sub-exposures may be divided as follows. A first sub-exposure-rotational of position 0 degrees (twist angle); second sub-exposure-rotational position (twist angle) 180 degrees with respect to first sub-exposure; third sub exposure 0 degrees twist angle; fourth sub exposure 180 degrees twist angle. In operation Two, a second ion exposure using an Ar+ implantation is performed at 1.5 keV ion energy, 24° tilt angle (ion angle of incidence with respect to perpendicular to the substrate plane), and 5E15/cm² total ion dose. The second exposure is divided into 10 sub-exposures with an ion dose of 2.5E14/cm² per sub-exposure, where the twist angle varies between successive sub-exposures, generally as described above with respect to the first exposure. For example, in embodiments where the patterning feature is a line having opposing sidewalls, the ten sub-exposures may be divided as follows: first sub-exposure-rotational of position 0 degrees (twist angle); second sub-exposure-rotational position (twist angle) 180 degrees with respect to first sub-exposure; third sub exposure 0 degrees twist angle; and so forth.

Figure 4:
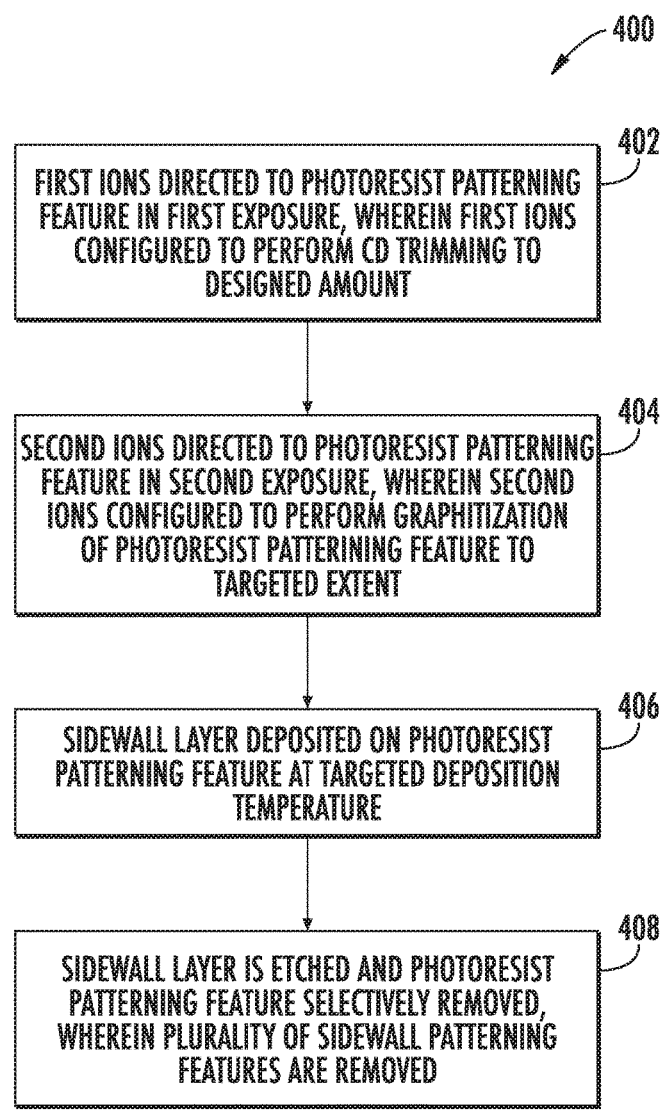
FIG. 4 depicts an exemplary process flow.

FIG. 4 depicts an exemplary process flow 400. At block 402, first ions are directed to a photoresist patterning feature in a first exposure. The first ions may be configured to perform CD trimming to a designed amount. At block 404, second ions are directed to the photoresist patterning feature in a second exposure. The second ions may be configured to perform graphitization of the photoresist patterning feature to a targeted extent. For example, after exposure to the second ions the photoresist patterning feature may be thermally stable to at least 300° C. The first ions and second ions may also be configured to achieve the targeted LER reduction while accomplishing CD trimming and resist graphitization.

At block 406, a sidewall layer is deposited on the photoresist patterning feature at a targeted deposition temperature, where the deposition temperature may be 200° C. or greater. The sidewall layer may comprise an oxide such as silicon oxide, and may be deposited by CVD or ALD in some embodiments.

At block 408, the sidewall layer is etched and the photoresist patterning feature is selectively removed, wherein a plurality of sidewall patterning features is formed.

In summary, the present embodiments provide advantages including the ability to use a higher temperature sidewall deposition process for use in an SAMP patterning scheme. The present embodiment further provides the advantages of reducing photoresist height loss, relaxing the height requirement for a photoresist patterning feature, and accordingly facilitating easier ability to perform CD trimming and LER reduction using angled ions.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method for patterning a substrate, comprising:
providing a photoresist patterning feature on the substrate, the substrate defining a substrate plane, the photoresist patterning feature having a softening temperature below 200° C.;
directing ions into the photoresist patterning feature during a first exposure; and
after the directing the ions, depositing a sidewall layer on the photoresist patterning feature at a deposition temperature, the deposition temperature being 200° C. or greater, wherein the photoresist patterning feature is thermally stable during the depositing the sidewall layer.

2. The method of claim 1,
wherein the photoresist patterning feature comprises a first carbon concentration before the directing the ions,
wherein the photoresist patterning feature comprises a second carbon concentration after the directing the ions, wherein the second carbon concentration is greater than the first carbon concentration.

3. The method of claim 1,
wherein the photoresist patterning feature comprises an oxygen-containing polymer,
wherein the photoresist patterning feature comprises a first oxygen concentration before the first exposure,
wherein the photoresist patterning feature comprises a second oxygen concentration after the first exposure, wherein the second oxygen concentration is less than the first oxygen concentration.

4. The method of claim 1,
wherein the photoresist patterning feature comprises a first bulk density before the first exposure,
wherein the photoresist patterning feature comprises a second bulk density after the first exposure, wherein the second bulk density is greater than the first bulk density.

5. The method of claim 1 wherein the ions comprise a silicon-containing ion species, hydrogen, helium, argon, carbon, nitrogen, or xenon.

6. The method of claim 1, wherein the ions generate a ratio of carbon to oxygen in the photoresist patterning feature of greater than 4:1.

7. The method of claim 1, the photoresist patterning feature having a first feature width before the first exposure, and having a second feature width after the first exposure, wherein the second feature width is less than the first feature width.

8. The method of claim 1, wherein the directing the ions comprises directing a first ion species, wherein the first ion species comprises hydrogen ions, silicon ions, or argon ions, the method further comprising directing a second ion species in a second exposure to the photoresist patterning feature, wherein the second ion species comprise argon ions, silicon ions, carbon ions, krypton ions, xenon, ions or germanium ions.

9. The method of claim 8, wherein the first ion species and the second ion species are directed at an ion trajectory forming a non-zero angle of incidence θ with respect to a perpendicular to the substrate plane, wherein θ is between 10 degrees and 60 degrees.

10. The method of claim 8, wherein the first exposure comprises an ion dose of 1E14/cm² to 2E16/cm² and an ion energy of 0.5 keV-20 keV.

11. The method of claim 8, wherein the second exposure comprises a total ion dose of 4E14/cm² to 3E16/cm² and an ion energy of 0.5 keV-3 keV.

12. The method of claim 1, wherein the first exposure comprises a plurality of sub-exposures, wherein a sub-exposure of the plurality of sub-exposures comprises: directing the ions at a first ion trajectory forming a non-zero angle of incidence θ with respect to a perpendicular to the substrate plane, and rotating the substrate through 180 degrees about the perpendicular, wherein the sub-exposure comprises an ion dose of 5E13/cm² to 5E14/cm².

13. The method of claim 1, wherein the deposition temperature is 300° C. to 350° C.

14. The method of claim 1, further comprising:
etching a portion of the sidewall layer, wherein the photoresist patterning feature is exposed; and
selectively removing the photoresist patterning feature, wherein a plurality of sidewall patterning features are formed.

15. A method for patterning a substrate, comprising:
providing a photoresist patterning feature on the substrate, the photoresist patterning feature having a first critical dimension (CD) and having a first carbon concentration;
directing first ions to the photoresist patterning feature, wherein after the directing the first ions the photoresist patterning feature attains a second CD, less than the first CD;
directing second ions to the photoresist patterning feature, wherein after the directing the second ions the photoresist patterning feature has a second carbon concentration, wherein the second carbon concentration is greater than the first carbon concentration; and
after the directing the first ions and the second ions, depositing a sidewall layer on the photoresist patterning feature at a deposition temperature, the deposition temperature being 200° C. or greater, wherein the photoresist patterning feature is thermally stable during the depositing the sidewall layer.

16. The method of claim 15, wherein before the directing the first ions and the second ions, the photoresist patterning feature having a softening temperature below 200° C., and wherein after the directing the first ions and the second ions, the photoresist patterning feature is thermally stable to 300° C. or higher.

17. The method of claim 15, further comprising:
etching a portion of the sidewall layer to expose the photoresist patterning feature; and
selectively removing the photoresist patterning feature, wherein plurality of sidewall patterning features are formed.

18. A method for patterning a substrate, comprising:
providing a photoresist patterning feature on the substrate, the photoresist patterning feature having a first critical dimension (CD) and comprising an oxygen-containing polymer having a first oxygen concentration;
directing first ions to the photoresist patterning feature, wherein after the directing the first ions the photoresist patterning feature attains a second CD, less than the first CD;
directing second ions to the photoresist patterning feature, wherein after the directing the second ions the photoresist patterning feature has a second oxygen concentration, wherein the second oxygen concentration is less than the first oxygen concentration; and
after the directing the first ions and the second ions, depositing a sidewall layer on the photoresist patterning feature at a deposition temperature, the deposition temperature being 200° C. or greater wherein the photoresist patterning feature is thermally stable during the depositing the sidewall layer.

\* \* \* \* \*